(12) United States Patent
Van der Plas et al.

(10) Patent No.: US 8,199,043 B2
(45) Date of Patent: Jun. 12, 2012

(54) COMPARATOR BASED ASYNCHRONOUS BINARY SEARCH A/D CONVERTER

(75) Inventors: Geert Van der Plas, Leuven (BE); Bob Verbruggen, Kessel-lo (BE)

(73) Assignee: IMEC, Leuven (BE)

( * ) Notice: Subject to any disclaimer, the term of this patent is extended or adjusted under 35 U.S.C. 154(b) by 55 days.

(21) Appl. No.: 12/863,149

(22) PCT Filed: Jan. 22, 2009

(86) PCT No.: PCT/EP2009/050723
§ 371 (c)(1),
(2), (4) Date: Aug. 11, 2010

(87) PCT Pub. No.: WO2009/095349
PCT Pub. Date: Aug. 6, 2009

(65) Prior Publication Data
US 2010/0328120 A1    Dec. 30, 2010

Related U.S. Application Data

(60) Provisional application No. 61/024,952, filed on Jan. 31, 2008.

(30) Foreign Application Priority Data

Mar. 31, 2008    (EP) .................................... 08075253

(51) Int. Cl.
*H03M 1/38*    (2006.01)
(52) U.S. Cl. ........ 341/161; 341/110; 341/150; 341/159; 341/155

(58) Field of Classification Search .................. 341/161, 341/155, 156, 158, 110, 159, 150
See application file for complete search history.

(56) References Cited

U.S. PATENT DOCUMENTS

| | | | |
|---|---|---|---|
| 6,369,726 B1 | 4/2002 | Nagaraj et al. | |
| 6,784,821 B1 * | 8/2004 | Lee | ................................ 341/155 |
| 7,068,206 B2 * | 6/2006 | Augusto et al. | ............... 341/172 |
| 7,554,478 B2 * | 6/2009 | Lim | ................................ 341/169 |

FOREIGN PATENT DOCUMENTS

| | | |
|---|---|---|
| EP | 1079528 | 2/2001 |
| EP | 1367720 | 12/2003 |
| WO | WO2007/088175 | 8/2007 |
| WO | WO2008/006751 | 1/2008 |

OTHER PUBLICATIONS

Wicht, Bernhard et al., "Yield and Speed Optimization of a Latch-Type Voltage Sense Amplifier", IEEE Journal of Solid-State Circuits, Vol. 39, No. 7, Jul. 2004, pp. 1148-1158.

(Continued)

*Primary Examiner* — Jean B Jeanglaude
(74) *Attorney, Agent, or Firm* — McDonnell Boehnen Hulbert & Berghoff LLP

(57) ABSTRACT

An analog-to-digital converter that uses a comparator based asynchronous binary search is described. The architecture includes a self-clocked (asynchronous) hierarchical binary tree of comparators, each arranged for being provided with a predetermined threshold. The input signal is applied in parallel to all comparators as is the case with flash converters, but the clock is applied to (at least) one comparator only, for example to the first or root comparator. The at least one comparator is further arranged for controlling at least one other comparator of the plurality of comparators.

11 Claims, 5 Drawing Sheets

OTHER PUBLICATIONS

Yang, Jungwook et al., "A Current Boosting Full-Flash A/D Converter", Proceedings of the International Symposium on Circuits and Systems, May 10-13, 1992, vol. 2, pp. 609-612.

PCT International Search Report, PCT International Application No. PCT/EP2009/050723 dated May 18, 2009.

PCT Written Opinion, PCT International Application No. PCT/EP2009/050723 dated May 18, 2009.

Kobayashi, Tsuguo et al., "A Current-Controlled Latch Sense Amplifier and a Static Power-Saving Input Buffer for Low-Power Architecture", IEEE Journal of Solid-State Circuits, vol. 28, No. 4, Apr. 1993, pp. 523-527.

* cited by examiner

COMPARATOR BASED ASYNCHRONOUS BINARY SEARCH A/D CONVERTER

CROSS-REFERENCE TO RELATED APPLICATIONS

This application is a U.S. National Stage Entry of International Application No. PCT/EP2009/050723 filed on Jan. 22, 2009, which claims priority to U.S. Provisional Application No. 61/024,952 filed on Jan. 31, 2008 and European Application No. EP08075253.8 filed on Mar. 31, 2008, all of which are herein incorporated by reference for all purposes.

FIELD OF THE INVENTION

The present invention relates to an analog-to-digital converter architecture, wherein a comparator based asynchronous binary search is used.

BACKGROUND OF THE INVENTION

In recent years significant progress is made in lowering the power consumption in medium- to high-speed (tens of MS/s to a few GS/s) and medium- to low-resolution (4 bit to 9 bit) A/D converters. Current state-of-the-art Figure of Merit (FoM) is 65 fJ. The FoM is determined as $$FoM = \frac{P}{2^{ENOB} \cdot F_{sample}}$$

and represents the energy needed per conversion step. P denotes power in W, $F_{sample}$ sample rate in 1/s and ENOB stands for the Effective Number of Bits. These efficiency improvements are primarily driven by mobile, wireless applications and sensor networks.

Flash architectures, as in WO2008/006751, are often chosen because they offer the largest speed. However, area and power depend exponentially on the resolution since the comparators are often the largest contributor to the overall power consumption. The bits are determined via a parallel search. On the other hand, a low-power SAR-based architecture is presented in patent application WO2007/088175.

Another possible approach to reduce the power consumption and increase the speed of a converter is by splitting the conversion process into two steps. A 1-bit folding front-end can for example be used in combination with a flash ADC as presented in patent document U.S. Pat. No. 6,369,726, reducing the number of comparators.

In patent document EP1079528-A1 a current-mode ADC is proposed that uses an asynchronous search algorithm in which each comparator in a set is triggered by its neighbour in a non-hierarchical way (i.e. all comparators have the same weight or importance), and a current is used to alter the input current. The architecture relies on current mode to realize low-voltage operation and hence to save on power.

In the paper "A current boosting full-flash A/D converter" (Jungwook Yang et al., *Proc. Int'l Symp. On Circuits and Systems*, San Diego, vol. 2, 3 May 1992, pp. 609-612) the number of activated comparators in a flash converter is reduced by selecting a relevant set. The range finder circuit introduced by the authors are clocked synchronously (all at the same time) and based on their outputs only a part of the comparators of the flash converter are deactivated by reducing their biasing current and hence reducing power consumption.

SUMMARY OF THE INVENTION

An analog to digital conversion circuit is presented comprising a plurality of comparing means each being provided with a predetermined threshold and arranged for being fed with a version of a same input voltage signal and whereby at least one comparing means is arranged for being fed with a clock signal. The at least one comparing means is further arranged for controlling or triggering at least one other comparing means of the plurality of comparing means. In a preferred embodiment this plurality of comparing means is structured in at least two hierarchical levels, meaning that the layers form a hierarchical tree wherein each layer determines the value of the input signal to a smaller degree than the preceding layer. It is checked if the signal is smaller or bigger than half of the range and then inside half a range smaller or bigger than a quarter of the range etc. ... A comparing means at the highest hierarchical layer is arranged for being fed with the clock signal.

A Comparator based Asynchronous Binary Search (CABS) architecture is presented to minimize power consumption. The only active circuits needed are dynamic comparing means to which a predetermined threshold can be applied. An example of comparing means can be comparators with embedded thresholds. The architecture offers a power consumption that is proportional to the sampling frequency. The architecture comprises a self-clocked (asynchronous) binary tree of comparing means (comparators). The input voltage signal is applied in parallel to all comparators as is the case with flash converters, but the clock is applied to the first or root comparator only. The architecture of the present invention combines a fast flash architecture with a classical SAR-approach. Typically, in a flash converter, the bits are determined via a parallel search, requiring a lot of power consuming comparators. By using (preferably) a binary search instead of a parallel one, the number of active comparators is reduced and therefore the power consumption.

In an alternative embodiment the architecture further comprises a delay circuit and a digital-to-analog converter (DAC) between two subsequent hierarchical layers. Based on the decision of a comparing means, this DAC outputs a signal that either adds or subtracts from the sampled input voltage a value depending on the weight of the decision. The input voltage signal is thus updated. Again, a self-clocked chain of comparators (with threshold at zero), with inserted delay circuits, controls this DAC. By using that DAC, a successive approximation process or binary search algorithm may be implemented. In this embodiment the comparators at lower hierarchical layers are fed with an input signal being a combination of the input voltage signal and the updating signal output by the DAC.

In a preferred embodiment an analog-to-digital conversion circuit is presented for converting an analog signal into a digital representation with n bits. In a first block, m bits are determined via an architecture comprising a self-clocked chain of comparators with delay blocks controlling a DAC implementing the successive approximation process. In a second block, n-m bits are determined via the CABS architecture.

In an alternative embodiment a method is presented for converting an analog signal into a digital representation of this analog signal. The method comprises the steps of: applying this signal to each comparing means (e.g. a comparator) of an analog-to-digital conversion circuit, comparing this input signal with the predetermined threshold of an at least one comparator and controlling (triggering) a second comparator based on the comparison in the previous step. The analog-todigital converter comprises a plurality of comparators each configured to have a predetermined threshold and whereby at least one comparator of this plurality is fed with a clock signal.

In a preferred embodiment the plurality of comparing means is structured in at least two hierarchical layers and the at least one comparing means to which the clock signal is fed, is at higher hierarchical layer then the second comparator.

In an embodiment the step of comparing yields a binary output signal. An unsigned binary code is obtained by taking an OR of all '>' output pins of the activated comparators on each layer of the binary tree. For an n-bit ADC, this architecture contains $2^n-1$ comparators, similar to a flash ADC, but of which, only n comparators are activated during quantization, with n OR encoder functions to determine the outputs. This drastically lowers the power consumption.

In another embodiment the step of comparing yields an output signal that is fed to a DAC, implementing a successive approximation process. A binary code is determined.

The CABS can be read out by taking an OR of all '>' (greater than) output pins of the activated comparators on each layer. This has a beneficial effect on the power consumption.

BRIEF DESCRIPTION OF THE DRAWINGS

Preferred embodiments are described below in conjunction with the appended drawing figures, wherein like reference numerals refer to like elements in the various figures.

DETAILED DESCRIPTION OF EMBODIMENT(S)

Figure 1:
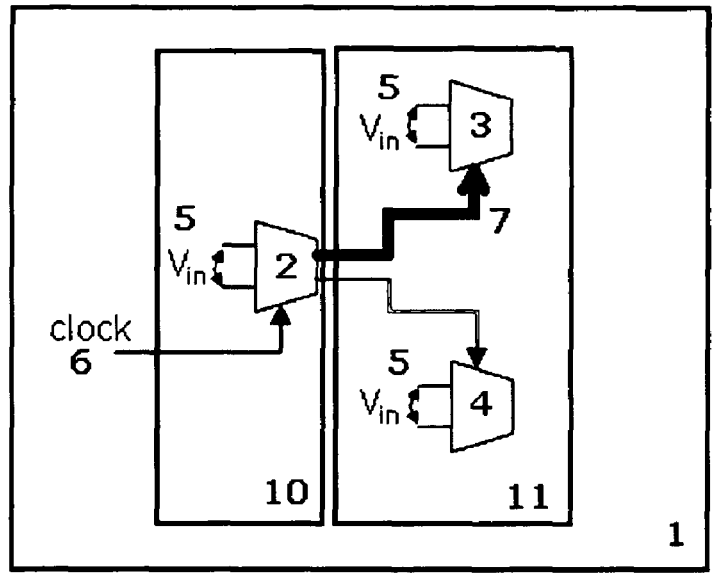
FIG. 1 represents a block diagram of the present invention.

The present invention will be described with respect to particular embodiments and with reference to certain drawings but the scope is not limited thereto but only by the claims. The drawings described are only schematic and are non-limiting. In the drawings, the size of some of the elements may be exaggerated and not drawn on scale for illustrative purposes.

An analog to digital conversion circuit (1) is presented as shown in FIG. 1, comprising a plurality of comparing means (2, 3, 4) like comparators, preferably structured in layers (10,11). In the higher up layer (10) more important decisions with a bigger impact are taken than in lower layer (11). In this way an hierarchical tree is created by the various layers. Each comparing means has a predetermined threshold, which may have been fed to the comparing means. Each comparator (or other comparing means) is arranged for being fed with a same input signal (5). At least one comparator (2) is arranged for being fed with a clock signal (6), thereby controlling or triggering (7) at least one other comparator (3) of said plurality of comparators (2, 3, 4). By controlling is meant that a comparing means is arranged for selecting a path in the structure formed by the plurality of comparing means. The clock signal (6) is preferably applied to the comparator (2) of the highest hierarchical layer (10).

In a preferred embodiment the architecture of the present invention is based on combining a fast flash architecture with a classical SAR-approach. Typically, in a flash converter the bits are determined via a parallel search, requiring a lot of power consuming comparators. By using (preferably) a binary search instead of a parallel one, the number of active comparators and therefore the power consumption is reduced. The proposed architecture leverages the advantages of both techniques. In other words, an analog-to-digital converter is presented that uses a Comparator based Asynchronous Binary Search (CABS) architecture to minimize power consumption. The only active circuits needed are dynamic comparators with embedded threshold. The architecture offers a power consumption that is proportional to the sampling frequency.

Figure 2:
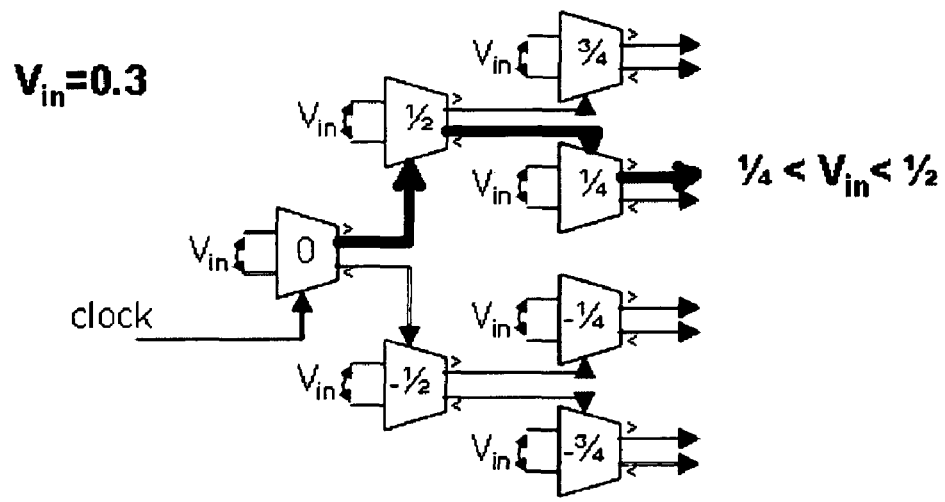
FIG. 2 illustrates the proposed CABS hierarchical binary tree architecture.

The operation of the proposed CABS architecture is exemplified in FIG. 2. The example is illustrated for $V_{in}=0.3$ and n=3 (number of hierarchical levels and hence also the number of bits). The black bold line gives the binary search sequence. In a first step the sign of the input is determined (> or <0). In a second step the input is compared to half the range and in a third step to ¼ of the range. Only 3 (or n) comparators need to be activated, instead of 7 (or $2^n-1$). The clock signal is only applied to the root comparator. A comparator of a second level is triggered or controlled by the comparator of the first comparison step. In other words, the various levels in the structure are hierarchically ordered. This hierarchical order is also reflected in the range covered by a comparator: the comparator at the highest level covers the full scale range, the two comparators at the level below each cover only half of the range etc. . . .

Figure 3:
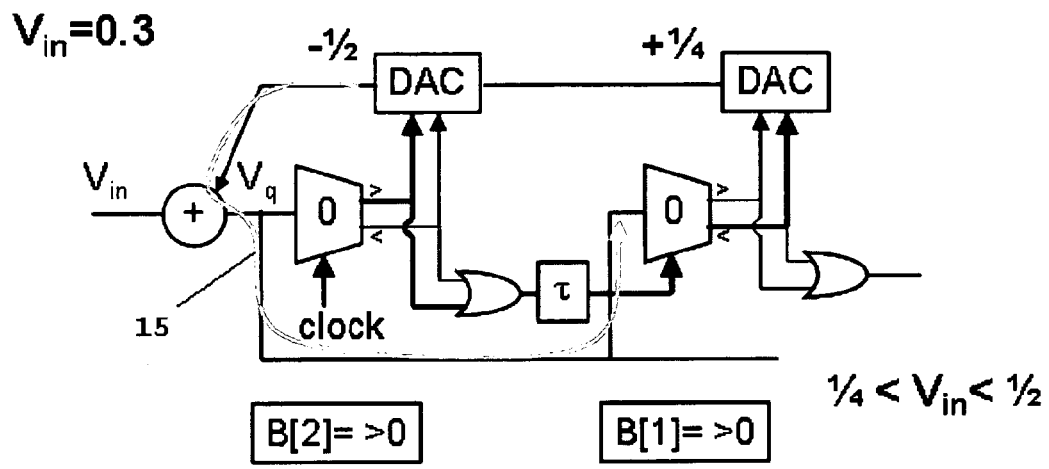
FIG. 3 illustrates the proposed comparator chain architecture.

In an alternative embodiment the architecture comprises a self-clocked chain of comparators (with threshold at zero) with inserted delay blocks controlling a DAC implementing the successive approximation process or binary search. The DAC (40) converts the decision of the previous comparator into an analogue voltage (41) that must be added to/subtracted from the input voltage signal. The delay circuit (17) can be implemented using inverters with limited drive strength. The presence of the delay block provides the DAC some time to adapt the input signal of the next comparator in the chain (15). The settling of the DAC occurs faster than the logic delay time τ. FIG. 3 shows the proposed comparator chain for two bits. Again, the clock signal is only applied to the comparator of the highest hierarchical level and a comparator of a second level is triggered by the first comparison step. In this embodiment a SAR controller is implemented. The output of the first comparison is applied to a DAC (40). The example is illustrated for $V_{in}=0.3$ and n=2. In every step, the input is compared to zero. In the first step, the DAC subtracts ½ of the full-scale range in charge from one of the input nodes (0.3>0). In a second step, the DAC adds ¼ (−0.2<0) to the input. Note that in this embodiment the SAR approach has been used for reading out the binary code. The SAR register is hence formed by the comparator outputs at each layer (to be more precise, by the positive output).

Both embodiments can be combined. This results in an analog-to-digital conversion circuit, converting an analog signal into a digital representation with n bits. In a first block, m bits are determined via an architecture comprising a self-clocked chain of comparators with delay blocks controlling a DAC implementing the successive approximation process. In a second block, n-m bits are determined via the CABS architecture.

Figure 4:
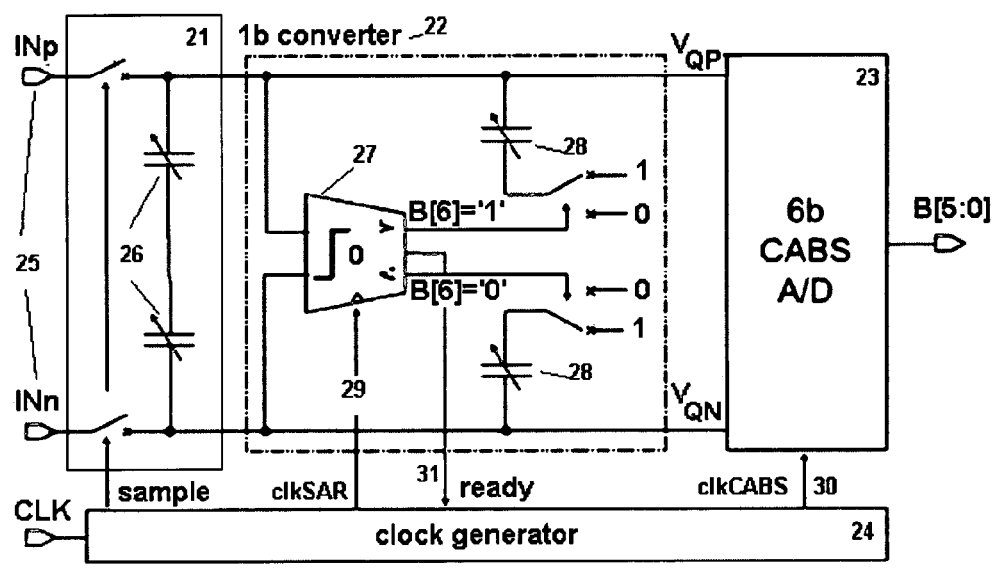
FIG. 4 illustrates the architecture of the 2-step 7 bit ADC, 1 bit coarse A/D and D/A followed by a 6 bit CABS ADC.
Figure 5:
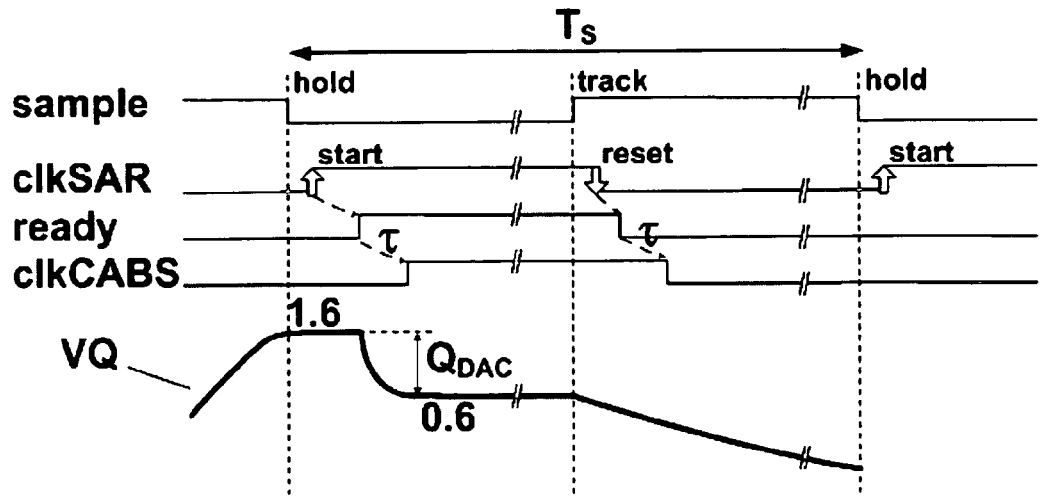
FIG. 5 illustrates schematically the clocking.

This combination is illustrated for a 7 bit ADC. The present invention is illustrated in FIG. 4 and provides a 2-step 7 bit ADC comprising a track and hold (T/H) circuit (21), followed by a 1 bit comparison and D/A conversion (22), and a 6 bit comparator-based asynchronous binary-search (CABS) conversion (23), whereby the different blocks are steered by a clock generator (24). The 7b ADC operates as follows: the passive T/H circuit (21) samples the input signal (25) on a capacitance (26), the 1 bit comparator (27) determines the sign of the input (MSB, B[6]) and steers a capacitive DAC (28). The DAC subtracts ¼ of the full-scale range in charge from one of the input nodes, changing simultaneously differential signal and common-mode level to be in range of the 6 bit CABS converter (23). The clock buffer (24) generates the 1 bit coarse ND clock signal (29) and starts (30) the 6 bit fine conversion after the 1 bit D/A conversion has finished (31). This clocking is graphically represented in FIG. 5.

Figure 6:
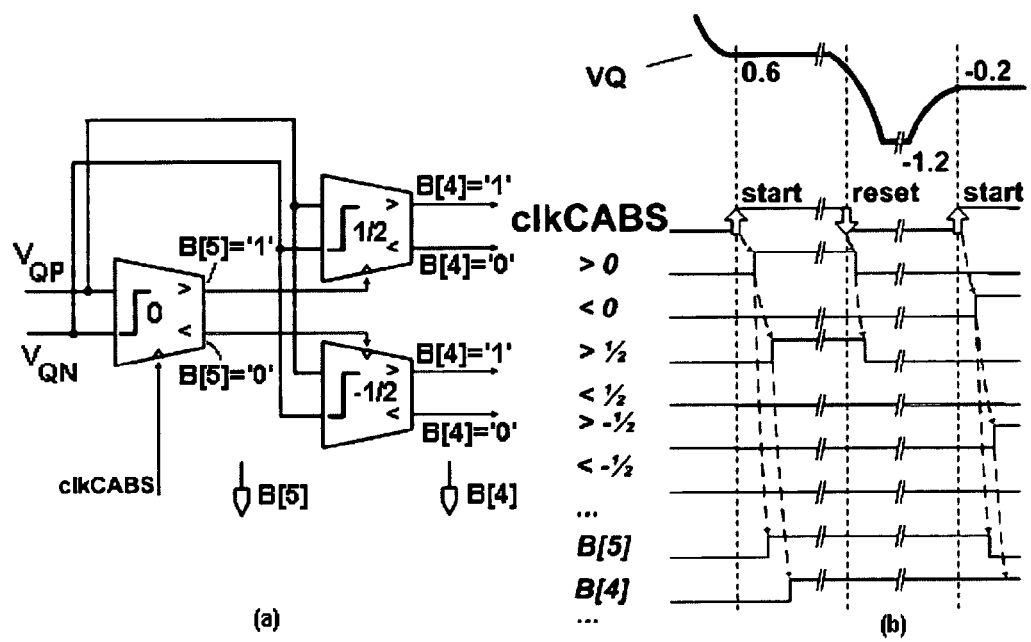
FIG. 6 shows the comparator-based asynchronous binary-search operating principle of the 6 bit converter.

The 6 bit CABS converter comprises a self-clocked (asynchronous) binary tree of comparators with embedded threshold. A conceptual block diagram is shown in FIG. 6(a) (for the two MSBs only). The input signal is applied in parallel to all comparators as is the case with flash converters, but the clock (30) is applied to the root comparator only. This comparator determines if the sampled signal is above or below 0 and outputs this on either its '<' (lower than) or '>' (greater than) pin. One of the comparators (3,4) in the next layer of the binary tree is then triggered asynchronously, i.e. either the ½ or the –½ scale comparator (waveforms shown in FIG. 6(b)). An unsigned binary code is obtained by taking an OR of all '>' output pins of the activated comparators on each layer. For an n-bit ADC, this architecture contains $2^n-1$ comparators, similar to a flash ADC, but of which, only n comparators are activated during quantization, with n OR encoder functions to determine the outputs. This drastically lowers the power consumption. A clock signal starts and resets the level-triggered quantization process. Note that in contrast to standard asynchronous SAR implementations, in this architecture a comparator is not reset immediately. Only when the whole quantization process is finished, the n activated comparators are reset from the root comparator following the same path as during quantization. This reset phase overlaps with the tracking phase of the T/H circuit.

Figure 7:
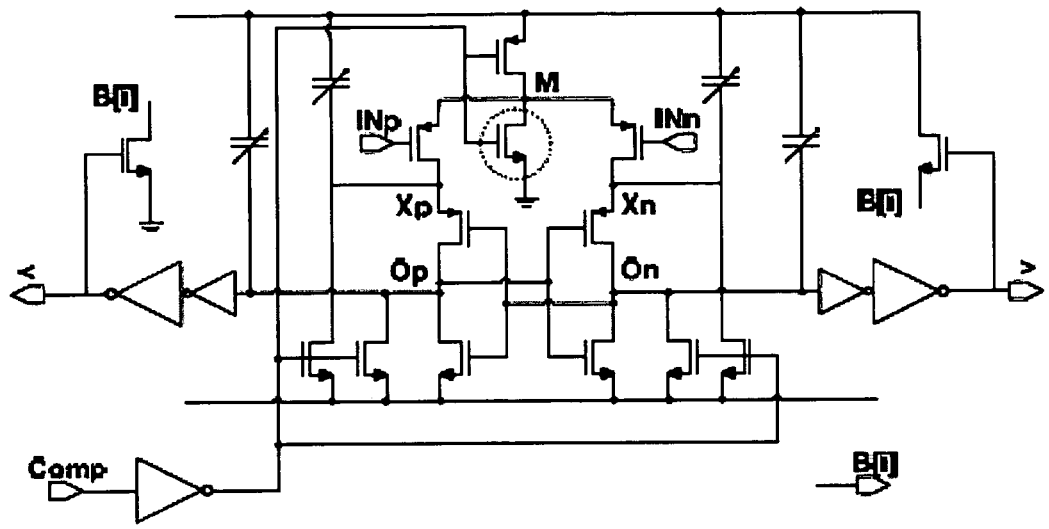
FIG. 7 shows schematically the circuit of the comparator and the encoder.

The comparator is implemented using a dynamic latch (see FIG. 7), as described for example in "A Current-Controlled Latch Sense Amplifier and a Static Power-Saving Input Buffer for Low-Power Architecture" (T. Kobayashi et al., *IEEE J. Solid-State Circuits*, vol. 28, no. 4, pp. 523-527, April 1993) or in "Yield and Speed Optimization of a Latch-Type Voltage Sense Amplifier" (B. Wicht et al., *IEEE J. Solid-State Circuits*, vol. 39, no. 7, pp. 1148-1158, July 2004). When the 'Comp' pin is low, the comparator is reset and both outputs are low. In contrast to the implementation of the Wicht paper, there is an additional NMOS device (indicated on FIG. 7) pulling down node 'M', to drive the PMOS input pair in accumulation. This is done to reduce the non-linearity of the input capacitance of the comparators since the input signal is sampled on this capacitance. A rising edge on 'Comp' turns on the PMOS input pair (which contains an intentional imbalance to set its threshold level) and the cross-coupled regenerative latch amplifies the input signal to a full logic level. This comparator circuit is sized as small as possible, thermal noise being the limiting performance metric. To compensate for the increased mismatch, calibration capacitances are added on all internal nodes of the comparator. The inverter stages at both outputs have a high input threshold to avoid causing a trigger event on both outputs. They also buffer the signal to drive the next comparator in the binary tree and the encoder transistors. The OR encoder function is implemented by driving the bitline B[i] (of the ith layer) by a pull-up transistor if the comparator decides 'greater than', and a pull-down transistor if the comparator decides 'lower than'. The non-activated comparators on each layer have a high-impedance output. When the comparator is reset, the outputs remain on the bit lines, so the output of the ADC is available after the quantization has finished and the comparators are reset.

Figure 8:
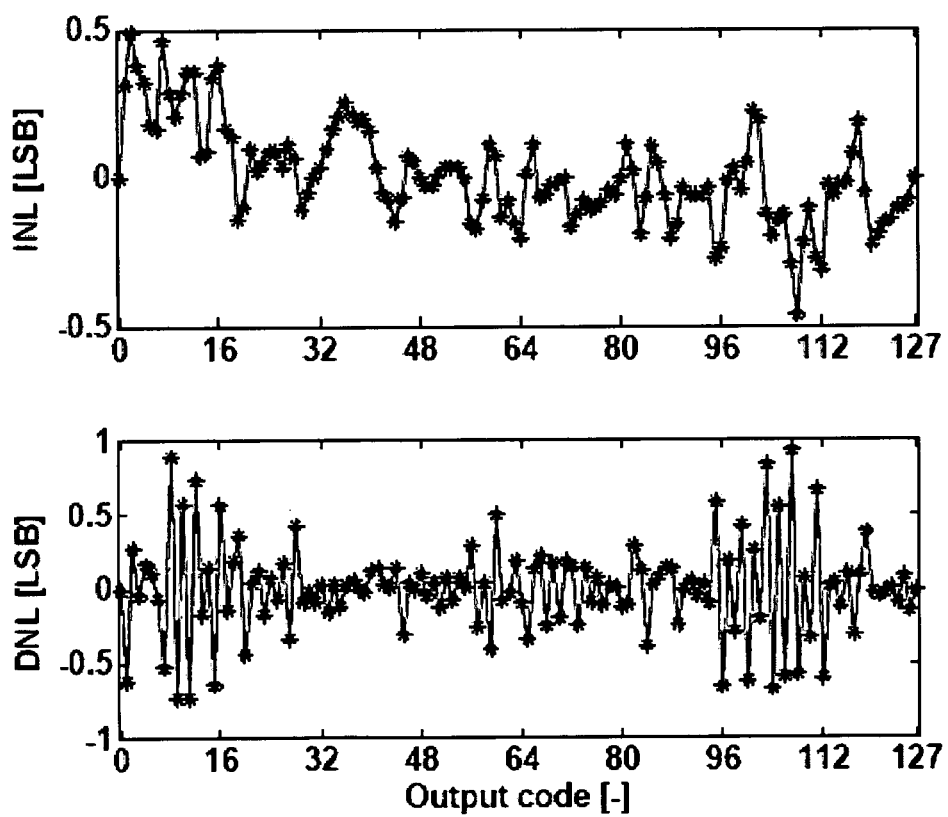
FIG. 8 plots the INL/DNL of ADC after calibration.
Figure 9:
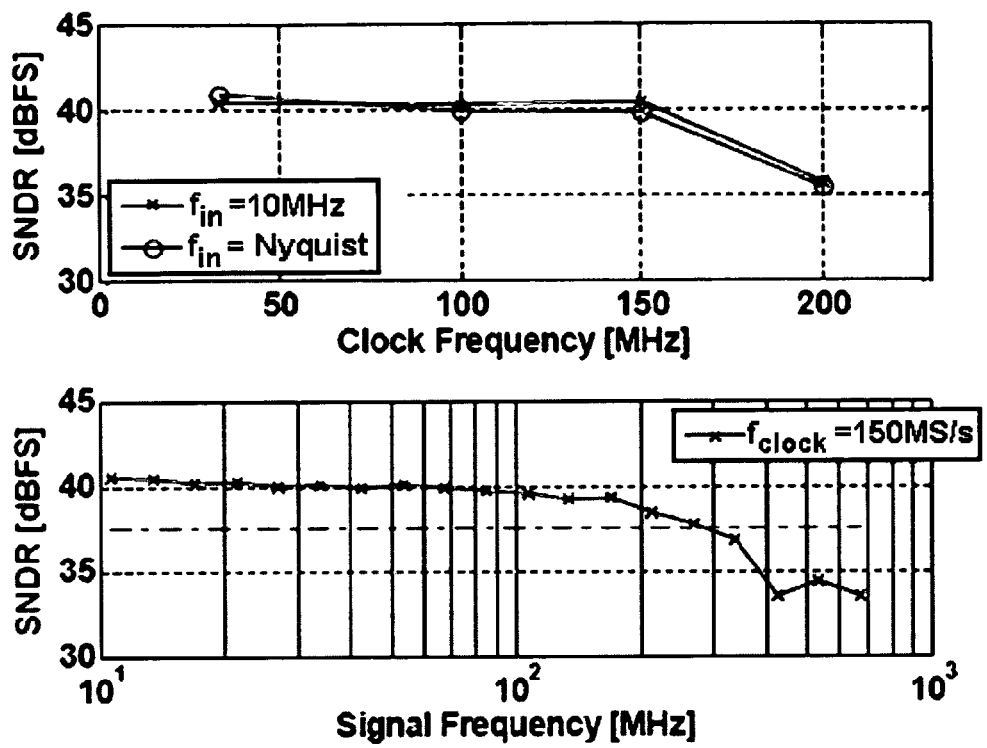
FIG. 9 plots the SNDR versus the clock frequency for a low frequency and Nyquist input frequency at different clock rates and the SNDR versus the signal frequency.
Figure 10:
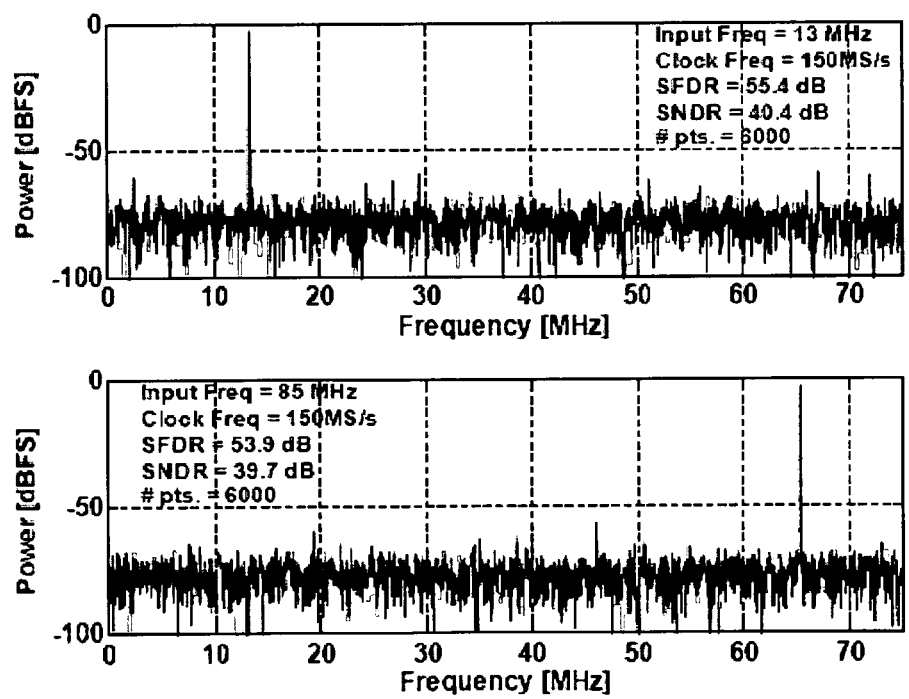
FIG. 10 plots the low frequency and the Nyquist power spectra.

The converter is implemented in a 1V 90 nm digital CMOS using low- and regular-$V_T$ devices only. The ADC is calibrated as follows: for each comparator the desired threshold is applied at the input and the digital calibration code is found with a binary search where the ADC output toggles 50% between the two codes. The capacitive DAC is calibrated similarly, by applying two thresholds and using a comparator to determine when the step is exactly ¼ of full scale. Both feedback capacitances $C_{in-DA}$ (coarse steps) as well as $C_{in}$ (fine steps) are calibrated in this way (FIG. 3). Once calibrated, the ADC is characterized for different clock frequencies. A maximum INL (integral non-linearity) and DNL (differential non-linearity) of 0.48 and 0.93LSB are obtained (FIG. 8) where the LSB size is 6 mV. At clock frequencies up to 150 MS/s, the ADC achieves 40 dB SNDR over the whole Nyquist band, the Effective Resolution Bandwidth (ERBW) is 270 MHz (FIG. 9). Because of the fully dynamic implementation, the power consumption scales linearly with the sampling rate and is equal to 0.89 µW per MHz of clock rate. This gives a FOM of 10 fJ/conversion-step. For comparison, the FOM of the ADC above 100 MS/s and for 6 bits and more has been improved from 220 fJ to 10 fJ/Conversion step. The power spectra of a full-scale low-frequency and Nyquist input signal at 150 MS/s are shown in FIG. 10, the Spurious Free Dynamic Range (SFDR) is 55.4 dB for a low-frequency.

Although the present invention has been illustrated by reference to specific embodiments, it will be apparent to those skilled in the art that the invention is not limited to the details of the foregoing illustrative embodiments, and that the present invention may be embodied with various changes and modifications without departing from the spirit and scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the spirit and scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", "third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. An analog to digital conversion (ADC) circuit comprising:
   a plurality of comparing means, including a first, a second, and a third comparing means collectively arranged as at least part of a self-clocked chain, each comparing means of the plurality configured to receive a same input voltage signal and each configured with a respective predetermined threshold with which to compare the input voltage signal,
   wherein the first comparing means is further configured to receive a clock signal, and to send a respective trigger signal to at least one of the second comparing means and the third comparing means,
   and wherein the first comparing means is further configured to select a path through the self-clocked chain by comparing the input voltage signal with the respective predetermined threshold of the first comparing means in order to make a binary choice of controlling either the second comparing means or the third comparing means with the respective trigger signals.

2. The ADC circuit of claim 1, wherein the plurality of comparing means is configured to form a hierarchical tree structure comprising a hierarchy of levels,
   and wherein any given level of the hierarchy of levels comprises a smaller number of comparing means than a next level down in the hierarchy of levels, and comprises a larger number of comparing means than a next level up in the hierarchy of levels.

3. The ADC circuit of claim 2, wherein the hierarchy of levels includes at least a first level and a second level, the first level being one level above the second level in the hierarchy of levels,
   and wherein the first comparing means is further configured to occupy the first level, and the second and third comparing means are both configured to occupy the second level.

4. The ADC circuit of claim 3, wherein the first level is a highest level above which there are no higher levels,
   and wherein the clock signal is configured to originate from a source other than a comparing means of the plurality of comparing means.

5. The ADC circuit of claim 3, wherein at least one level of the hierarchy of levels is configured above the first level, the at least one level comprising an upper comparing means,
   and wherein the clock signal is configured to originate as a trigger signal from the upper comparing means.

6. The ADC circuit of claim 3, further comprising:
   a delay circuit configured between the first and second levels, and further configured to be controlled by the first comparing means; and
   a digital-to-analog converter (DAC) configured between the first and second levels, and further configured to be controlled by the first comparing means and to output a signal for updating the input voltage signal,
   wherein the first comparing means is further configured to control each of the delay circuit and the DAC.

7. An analog to digital conversion (ADC) circuit for converting an analog signal into an n-bit digital representation of the analog signal, the ADC circuit comprising a first circuit and a second circuit, each of the first and second circuits comprising:
   a plurality of comparing means arranged as at least one self-clocked chain, each comparing means configured to receive the analog signal and each configured with a respective predetermined threshold with which to compare the analog signal,
   wherein the plurality of comparing means is arranged to form a hierarchical tree structure having a hierarchy of levels, including an upper level comprising an upper comparing means and a lower level comprising two lower comparing means, the upper level being one level above the lower level in the hierarchy of levels,
   wherein the upper comparing means is further configured to receive a clock signal and to select a path through the at least one self-clocked chain by comparing the analog signal with the respective predetermined threshold of the upper comparing means in order to make a binary choice of controlling one or the other of the two lower comparing means with a respective trigger signal,
   wherein the first circuit further comprises:
      a delay circuit configured between the upper and lower levels, and further configured to be controlled by the upper comparing means; and
      a digital-to-analog converter (DAC) configured between the upper and lower levels, and further configured to be controlled by the upper comparing means and to output a signal for updating the analog signal,
      wherein the upper comparing means is further configured to control each of the delay circuit and the DAC,
   and wherein the first circuit is configured to determine m bits of the n-bit digital representation of the analog signal, and the second circuit is configured to determine n-m bits of the n-bit digital representation of the analog signal.

8. A method of converting an analog signal into a digital representation of the analog signal, the method comprising:
   receiving the analog signal at each of a plurality of comparing means of an analog-to-digital conversion circuit, including a first, a second, and a third comparing means collectively arranged as at least part of a self-clocked chain, each comparing means having a respective predetermined threshold;
   receiving a clock signal at the first comparing means; and
   at the first comparing means, selecting a path through the self-clocked chain by making a comparison the analog signal with the respective predetermined threshold of the first comparing means, and based on the comparison making a binary choice of controlling either the second comparing means or the third comparing means with a respective trigger signal.

9. The method of claim 8, wherein the plurality of comparing means forms a hierarchical tree structure comprising a hierarchy of levels, including at least a first level and a second level, the first level being one level above the second level in the hierarchy of levels,
   wherein the first level includes the first comparing means, and the second level includes the second and third comparing means,
   and wherein receiving the clock signal at the first comparing means comprises one of receiving the clock signal from a source other than a comparing means of the plurality of comparing means, and receiving the clock signal as a trigger signal from another comparing means of the plurality of comparing means.

10. The method of claim 8, wherein making a comparison of the analog signal with the respective predetermined threshold of the first comparing means comprises:
    at the first comparing means, yielding a binary output signal.

11. The method of claim 8, wherein making a comparison of the analog signal with the respective predetermined threshold of the first comparing means comprises:
    at the first comparing means, feeding an output signal to a digital-to-analog converter.

* * * * *